(12) United States Patent
Lee et al.

(10) Patent No.: US 8,613,901 B2
(45) Date of Patent: Dec. 24, 2013

(54) TITANIUM OXIDE NANO TUBE MATERIAL AND METHOD FOR MANUFACTURING THE SAME

(75) Inventors: Sang-Wook Lee, Seoul (KR); Ik-Jae Park, Paju-si (KR); Dong-Hoe Kim, Seongnam-si (KR); Kug-Sun Hong, Seoul (KR); Gil-Sang Han, Anyang-si (KR); Hyun-Suk Jung, Seoul (KR)

(73) Assignee: SNU R&DB Foundation, Seoul (KR)

( * ) Notice: Subject to any disclaimer, the term of this patent is extended or adjusted under 35 U.S.C. 154(b) by 148 days.

(21) Appl. No.: 13/197,966

(22) Filed: Aug. 4, 2011

(65) Prior Publication Data

US 2012/0171112 A1    Jul. 5, 2012

(30) Foreign Application Priority Data

Dec. 29, 2010   (KR) ................. 10-2010-0137887

(51) Int. Cl.

| | |
|---|---|
| *C01G 23/047* | (2006.01) |
| *C30B 1/00* | (2006.01) |
| *C30B 3/00* | (2006.01) |
| *C30B 5/00* | (2006.01) |
| *C30B 28/02* | (2006.01) |
| *H01L 25/00* | (2006.01) |
| *H01L 31/00* | (2006.01) |

(52) U.S. Cl.
USPC ............... 423/610; 977/734; 117/8; 136/243

(58) Field of Classification Search
USPC ............... 423/608–616; 977/734, 762; 117/8; 136/243
See application file for complete search history.

(56) References Cited

U.S. PATENT DOCUMENTS

| 2009/0183994 A1 * | 7/2009 | Misra et al. ............... 205/340 |
| 2010/0187172 A1 * | 7/2010 | Paulose et al. ............ 210/506 |
| 2011/0127167 A1 * | 6/2011 | Misra et al. ............... 205/200 |

OTHER PUBLICATIONS

Prakasam et al., "A New Benchmark for TiO2 Nanotube Array Growth by Anodization", J. Phys. Chem. C 2007, 111, 7235-7241.*
Raja et al., "Effect of water content of ethylene glycol as electrolyte for synthesis of ordered titania nanotubes", Electrochemistry Communications 9 (2007) 1069-1076.*
Shankar et al., "Highly ordered TiO2 nanotube arrays up to 220 microns in length: use in water photoelectrolysis and dye-sensitized solar cells", Nanotechnology 18 (2007) 065707.*
Grimes, Craig A., "Synthesis and application of highly ordered arrays of TiO2 nanotubes," J. Mater. Chem., 2007, 17, 1451-1457.*
Varghese et al., "Crystallization and high-temperature structural stability of titanium oxide nanotube arrays," J. Mater. Res., vol. 18, No. 1, Jan. 2003.*
Mor et al., "A review on highly ordered, vertically oriented TiO2 nanotube arrays: Fabrication, material properties, and solar applications," Solar Energy Materials & Solar Cells 90 (2006) 2011-2075.*
Macak et al., "Smooth Anodic TiO2 Nanotubes," Angew. Chem. Int. Ed. 2005, 44, 7463-7465.*

* cited by examiner

*Primary Examiner* — Anthony J Zimmer
(74) *Attorney, Agent, or Firm* — Greer, Burns & Crain, Ltd.

(57) ABSTRACT

A titanium oxide nano tube material is configured so that crystal grains of a nano tube has a crystal structure oriented with the [001] direction of a tetragonal crystal system as a preferred direction. FWHM (Full Width at Half Maximum) of a rocking curve with respect to the (004) plane peak is 11.1 degrees to 20.3 degrees. The titanium oxide nano tube material has excellent photoelectric characteristics since the crystal grains of the nano tube are oriented with the (004) plane or the [001] direction of a tetragonal crystal system as a preferred direction.

12 Claims, 7 Drawing Sheets

TITANIUM OXIDE NANO TUBE MATERIAL AND METHOD FOR MANUFACTURING THE SAME

CROSS-REFERENCE TO RELATED APPLICATION

This application claims priority under 35 USC 119(a) to Korean Patent Application No. 10-2010-0137887 filed in the Republic of Korea on Dec. 29, 2010, the entire contents of which are incorporated herein by reference.

BACKGROUND OF THE DISCLOSURE

1. Field of the Disclosure

The present disclosure relates to a nano tube material and a method for manufacturing the same, and more particularly to a titanium oxide nano tube material in which crystal grains of the nano tube are oriented in a predetermined direction, and a method for manufacturing the same.

2. Description of the Related Art

One-dimensional nano tube architecture are advantageous in their unique charge transport and light penetration properties. Therefore, one-dimensional nano tube architecture have been under active research in the fields of solar energy conversion devices. In particular, nano tubes composed of titanium oxide and grown by anodizing have been conceived as one of the most promising photoelectrode materials in dye-sensitized solar cells (DSSC) due to efficient utilization of incident light and excellent charge collecting properties.

The titanium oxide nano tube-based DSSC is reported to have similar electron diffusion properties compared with nano particle film (NPF)-based DSSC. This is because the anatase crystals present in the photoelectrode of the DSSC have similar sizes and the crystal grains are oriented randomly. Therefore, if the $TiO_2$ nano tube composed of a single crystal or multi crystals with good orientation is applied to DSSC, the electron transport property of the DSSC may be improved. In recent, Grimes group showed this possibility by using vertically aligned single crystalline rutile nanorods. Generally, the electron diffusion coefficient of rutile nanoparticles is lower than the anatase nanoparticles, but when the vertically aligned single crystalline rutile nanorods are applied to the DSSC system, it was found that similar electron diffusion characteristics with NPF may be obtained.

Usually, the electron diffusion coefficient of rutile nanoparticles is lower than the anatase nanoparticles. Although considerable efforts have been focused on the titanium oxide nano tube-based DSSC, the study on the fabrication of single crystal-like or preferred-oriented anatase $TiO_2$ nano tube and the characterization of their charge transport properties has not been reported yet.

Typically, as-anodized amorphous nano tubes are transformed into the nano tubes composed of randomly oriented nano grains during an annealing process. This is responsible for the difficulty in the preparation of the single crystal-like or preferred-oriented anatase $TiO_2$ nano tube.

SUMMARY OF THE DISCLOSURE

The present disclosure is designed to solve the problems of the prior art, and therefore the present disclosure is directed to providing a titanium oxide nano tube material in which crystal grains of the nano tube are oriented with the (004) plane or the [001] direction of a tetragonal crystal system as a preferred direction.

The present disclosure is also directed to providing a method for manufacturing a titanium oxide nano tube material with improved photoelectric characteristics by finding and optimizing important process variables influencing the improvement of orientation characteristics of crystal grains of the nano tube.

Other objects and advantages of the present disclosure will be described later and should be understood by the embodiments of the present disclosure. In addition, objects and advantages of the present disclosure can be implemented by components defined in the appended claims and their combinations.

In one aspect of the present disclosure, there is provided a titanium oxide nano tube material in which crystal grains of a nano tube has a crystal structure oriented with the [001] direction of a tetragonal crystal system as a preferred direction, wherein FWHM (Full Width at Half Maximum) of a rocking curve with respect to the (004) plane peak is 11.1 degrees to 20.3 degrees. According to the present disclosure, the orientation characteristics of the crystal grains are further improved when the FWHM of the rocking curve is 11.1 degrees to 16.5 degrees.

In the present disclosure, a $I_{(004)}/I_{(200)}$ value of the titanium oxide nano tube material, which is a relative ratio of the peak intensities of the (004) plane and the (200) plane of XRD (X-ray Diffraction) data, is 5 or above, preferably 17 or above, more preferably 200 or above.

Preferably, the titanium oxide nano tube material includes an array of nano tubes of the anatase titanium oxide vertically grown by anodizing on a titanium substrate.

Preferably, an electron diffusion length of an electron carrier of the titanium oxide nano tube material is 20 μm to 50 μm, preferably 30 μm to 40 μm.

Preferably, the nano tube wall thickness of the titanium oxide nano tube material is 10 nm to 100 nm. In addition, the nano tube length of the titanium oxide nano tube material is 1 μm or above.

In another aspect of the present disclosure, a method for manufacturing a titanium oxide nano tube material includes: preparing an electrolyte with a moisture content of 1.5 to 2.5 wt %; growing a titanium oxide nano tube on a titanium substrate by anodizing in a state in which the titanium substrate is immersed in a container containing the electrolyte; cleaning and drying the titanium substrate on which the titanium oxide nano tube is grown; and annealing the dried titanium substrate to crystallize the grown titanium oxide nano tube so that crystal grains of the titanium oxide nano tube are oriented with the [001] direction of a tetragonal crystal system as a preferred direction.

In the present disclosure, it is more preferred that the moisture content in the electrolyte is controlled in the range from 2.0 to 2.4 wt %.

Preferably, the step of preparing the electrolyte includes removing residual moisture from the electrolyte; and adding 1.5 to 2.5 wt % of moisture to the electrolyte free from the residual moisture. The residual moisture in the electrolyte may be removed by evaporation.

Preferably, the titanium oxide nano tube is grown under an inert gas circumstance. The inert gas circumstance may use a nitrogen gas circumstance.

Preferably, the step of annealing the titanium substrate is performed in a temperature range from 300° C. to 600° C. for 10 minutes or more.

In another aspect of the present disclosure, there are provided photoelectric conversion devices including dye-sensitized solar cells, photocatalyst devices or the like, which uses the titanium oxide nano tube material according to the present disclosure as an electrode material.

In another aspect of the present invention, there are also provided various products including the titanium oxide nano tube material according to the present disclosure.

The titanium oxide nano tube material according to the present disclosure has excellent photoelectric characteristics since crystal grains of the nano tube are oriented with the (004) plane or the [001] direction of a tetragonal crystal system as a preferred direction. For example, after the titanium oxide nano tube material according to the present disclosure was used as photoelectrode materials of DSSC, it was found that the charge collection properties of the photoelectrode may be improved compared with the case where titanium oxide nano tube materials with randomly oriented crystal grains and titanium oxide nanoparticle films are applied to the DSSC. The improvement of the charge collection property is likely relevant to the shape and crystalline orientation of the nano tube. The preferred-oriented nano tube-based DSSC has a slow charge recombination and fast electron transport leading to the high charge collection properties. Therefore, it has an advantage in that it has a high short circuit current $J_{sc}$ and energy conversion efficiency. The titanium oxide nano tube material with such excellent properties may be applied not only to DSSC but also to various devices converting solar energy into electric energy and all products known in the art which may use the titanium oxide nano tube.

BRIEF DESCRIPTION OF THE DRAWINGS

Other objects and aspects of the present disclosure will become apparent from the following descriptions of the embodiments with reference to the accompanying drawings in which:

FIG. 1a shows a structure of a nano tube grown on a titanium substrate, FIG. 1b schematically shows crystal grains of the nano tube, which are oriented in a predetermined preferred direction (in other words, the [001] direction of a tetragonal crystal system), FIG. 1c shows crystal grains of the nano tube, which are randomly oriented.

In FIG. 2f, a small picture shows a SAD (Selected Area electron Diffraction) pattern of the nano tube.

DESCRIPTION OF THE PREFERRED EMBODIMENT

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation. Therefore, the description proposed herein is just a preferable example for the purpose of illustrations only, not intended to limit the scope of the present disclosure, so it should be understood that other equivalents and modifications could be made thereto without departing from the spirit and scope of the present disclosure.

After repeated researches, the inventors found that, when a titanium oxide nano tube is grown on a titanium substrate by means of anodizing, the moisture content of an electrolyte used for anodizing is an important factor in influencing the orientation characteristics of the crystal grains of the nano tube.

In other words, it was found that, only when the moisture content of the electrolyte is controlled to a certain range, the crystal grains of the nano tube will orient in a certain direction while the nano tube grown by anodizing is crystallized by annealing, which may improve photoelectric characteristics of the nano tube, for example charge carrier collection property, a charge moving speed and an electron diffusion length, and may decrease a charge carrier recombination speed.

In detail, the electrolyte used in the anodizing preferably has a moisture content of 1.5 wt % to 2.5 wt %, more preferably 2.0 wt % to 2.4 wt %. Since the range of the moisture content is small, precisely controlling the moisture content in the electrolyte by adding moisture to an electrolyte substantially free from residual moisture is most important above all.

Regarding the moisture content in the electrolyte, if the moisture content is smaller than 1.5 wt % or greater than 2.5 wt %, when the nano tube grown by the anodizing is annealed under a certain temperature condition, crystal grains are not oriented in a predetermined preferred direction.

The electrolyte may use an ethylene glycol solution to which a small amount of $NH_4F$ is added as an oxidizer. However, the present disclosure is not limited to a specific kind of electrolyte. Therefore, any electrolyte capable of growing titanium oxide into a nano tube by anodizing may be used.

Figure 1:
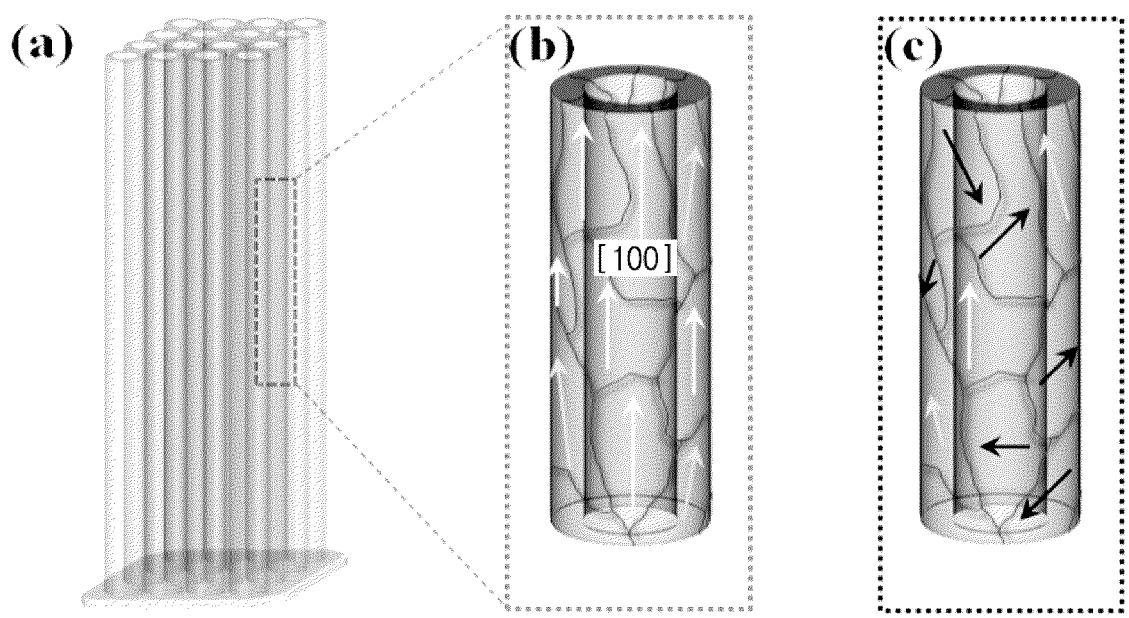
FIGS. 1a to 1c are schematic diagrams showing the structure of a titanium oxide nano tube material, where

FIGS. 1a to 1c are schematic diagrams showing the structure of a titanium oxide nano tube material, where FIG. 1a shows a structure of a nano tube grown on a titanium substrate, FIG. 1b schematically shows crystal grains of the nano tube, which are oriented in a predetermined preferred direction (in other words, the [001] direction of a tetragonal crystal system), FIG. 1c shows crystal grains of the nano tube, which are randomly oriented.

As shown in FIGS. 1a to 1c, the titanium oxide nano tube material according to the present disclosure has a structure in which a plurality of nano tubes made of anatase $TiO_2$ are grown in a vertical direction and are two-dimensionally arranged and closely packed. Hereinafter, this structure will be referred to as NTA (Nano Tube Array). In addition, each nano tube includes a plurality of crystal grains, and it should be noted that the plurality of crystal grains are oriented in a predetermined preferred direction as shown in FIG. 1b. This structure is distinctly different from that of FIG. 1c in which crystal grains are randomly oriented. The anatase $TiO_2$ has a tetragonal crystal system, and the preferred direction may be represented as the (004) plane direction or the [001] direction in the tetragonal crystal system.

In the present disclosure, the fact that the crystal grains of the titanium oxide nano tube have a predetermined preferred direction may be checked by XRD analysis for the nano tube.

In other words, the intensity ratios of peaks for (004) plane to (200) plane for the titanium oxide NTA according to the present disclosure, namely an $I_{(004)}/I_{(200)}$ value, is 5 or above, preferably 17 or above, more preferably 200 or above.

For reference, as the $I_{(004)}/I_{(200)}$ value increases, the diffraction intensity of X-ray in the (004) plane increases, which means that the amount of crystal grains oriented in the (004) plane perpendicular to an incident direction of X-ray is relatively greater than the amount of crystal grains with other crystal orientation. Therefore, the greater the $I_{(004)}/I_{(200)}$ value, the better the crystal grains will align in a preferred direction of the nano tube in the (004) plane or the [001] direction.

The moisture content of the electrolyte which gives a maximum $I_{(004)}/I_{(200)}$ value varies depending on the kind of the electrolyte or the kind of material to be grown into a nano tube. In the case where the electrolyte is ethylene glycol, where the oxidizer added to the electrolyte is $NH_4F$, and where the material to be grown is $TiO_2$, the $I_{(004)}/I_{(200)}$ value would be greatest when the moisture content in the electrolyte becomes about 2.2 wt %.

In addition, the fact that the crystal grains of the titanium oxide nano tube have a predetermined preferred crystalline direction may also be checked by FWHM (Full Width at Half Maximum) of a rocking curve with respect to the (004) plane peak of the XRD analysis data for the nano tube. Here, the rocking curve is a curve representing the change of X-ray diffraction intensity with respect to the change of an incident angle when X-ray is incident on a test piece, and it may be evaluated by the rocking curve how much the diffraction surface to be measured (here, the (004) plane) according to the incident angle of X-ray is distributed in the test piece. In addition, FWHM represents an angle width at the point where the intensity becomes a half based on the maximum intensity of the rocking curve.

In the titanium oxide nano tube material according to the present disclosure, FWHM of the rocking curve to the (004) plane peak of the XRD data is preferably 11.1 degrees to 20.3 degrees, more preferably 11.1 degrees to 16.5 degrees.

Preferably, the charge carrier diffusion length of the titanium oxide nano tube material is 20 μm to 50 μm, more preferably 30 μm to 40 μm.

Preferably, the nano tube wall thickness of the titanium oxide nano tube material is 10 nm to 100 nm. In addition, the nano tube length of the titanium oxide nano tube material is 1 μm or above.

Next, a method for manufacturing the titanium oxide nano tube material according to the present disclosure will be described.

First, an electrolyte whose moisture content is preferably 1.5 wt % to 2.5 wt %, more preferably 2.0 wt % to 2.4 wt % is prepared. The electrolyte is preferably prepared by removing residual moisture of the electrolyte and then adding 1.5 wt % to 2.5 wt % of moisture to the electrolyte free from residual moisture. The residual moisture of the electrolyte may be removed by evaporation, but the present disclosure is not limited thereto.

Next, a titanium oxide nano tube is grown on a titanium substrate by anodizing in a state in which the titanium substrate is immersed in a reaction container containing the electrolyte. Just after being grown, the nano tube has an amorphous structure, and hydroxyl groups are used as an oxygen source while the metal substrate is transited into metal oxide. Considering that crystal grains of the nano tube may be oriented in a certain preferred direction by controlling the moisture content of the electrolyte, it is apparent that the crystal grains are oriented in a certain preferred direction when the content of hydroxyl groups contained in the nano tube just grown is in a suitable range.

The electrolyte may use ethylene glycol containing a small amount of $NH_4F$ as an oxidizer. In addition, when the anodizing is performed, a Pt substrate is used as an opponent electrode, and a constant voltage of 50V may be applied between the titanium substrate and the Pt substrate. The time during which the anodizing is performed varies depending on the growing length of the nano tube.

If the titanium oxide nano tube is grown on the titanium substrate by anodizing, the titanium substrate is cleaned and dried. Organic solvents such as acetone and ethanol and distilled water may be used for cleaning the titanium substrate.

Meanwhile, when the anodizing is performed, it is necessary to prevent moisture from being introduced into the electrolyte. Therefore, the titanium oxide nano tube is preferably grown by anodizing under a nitrogen circumstance. As an alternative, the titanium oxide nano tube may be grown in a vacuum or under an inert gas circumstance.

If the titanium substrate is cleaned and dried, the titanium substrate is loaded to an annealing chamber to perform annealing. The annealing time may be controlled to 10 minutes or above, and the annealing temperature may be controlled in the range from 300° C. to 600° C.

While the annealing is performed, as the amorphous structure of the nano tube is changed into a plurality of crystal grains, the plurality of crystal grains is oriented in a certain preferred direction, in other words in the (004) plane direction or the [001] direction of a tetragonal crystal system. Accordingly, it is possible to obtain a titanium oxide nano tube in which crystal grains are oriented in a certain preferred direction.

The titanium oxide nano tube material according to the present disclosure has excellent photoelectric properties and may be applied to various devices in various uses. For example, the titanium oxide nano tube material according to the present disclosure may be used as an electrode material of a dye-sensitized solar cell, a photocatalyst device or the like.

Example

A Ti substrate with a thickness of 2 mm and a surface area of 0.5×0.5 $cm^2$ was grinded with a paste containing diamond grinding particles of 0.05 um, and then the grinded surface was cleaned using acetone, ethanol or distilled water.

A platinum substrate was used as an opponent electrode of the Ti substrate. The anodizing was performed for 5 hours while applying a DC voltage of 50V between the Ti substrate and the platinum substrate. If the anodizing is performed, the amorphous $TiO_2$ NTA is grown on the Ti substrate.

As for the electrolyte used for the anodizing, an electrolyte containing 99.75 wt % of ethylene glycol (produced by Sigma Aldrich) of 99.8% purity and 0.25 wt % of $NH_4F$ (produced by Sigma Aldrich) of 98% purity was used.

In order to evaluate the influence of moisture against NTA, water was added to the electrolyte by the content of 1.5 wt %, 2.0 wt %, 2.2 wt %, 2.4 wt % and 2.5 wt %, respectively, based on 100 wt % of electrolyte, to control the moisture content in the electrolyte in various ways.

The ethylene glycol easily absorbs moisture. Therefore, in order to accurately evaluate the influence of moisture against the properties of NTA, it is necessary to entirely remove residual moisture in the ethylene glycol before water is added to the electrolyte.

Therefore, before water is added to the electrolyte, residual moisture of the ethylene glycol was removed by evaporation. In addition, in order to prevent moisture in the air from being introduced into the electrolyte while the anodizing is performed, the anodizing was performed under a nitrogen circumstance.

Each $TiO_2$ NTA obtained by anodizing in electrolytes with different moisture contents was annealed in the air at 450° C. for 1 hour to crystallize NTA, thereby obtaining anatase $TiO_2$ NTA.

Comparative Example

Comparative Example is substantially identical to the Example of the present disclosure, except for the content of the moisture added to the electrolyte. In other words, in the Comparative Example, the content of moisture added to the electrolyte was controlled out of the range from 1.5 wt % to 2.5 wt %, in other words to 1.0 wt %, 3.0 wt %, 4.0 wt %, 5.0 wt % and 10.0 wt %. In addition, the anodizing conditions and the annealing conditions are identical to those of the Example of the present invention. Moreover, in another comparative example, a nanoparticle coating layer made of $TiO_2$ was formed on the Ti substrate, and the annealing was performed under the same conditions as in the Example of the present disclosure. The nanoparticle coating layer was formed by coating the Ti substrate surface with a sludge containing anatase $TiO_2$ nanoparticles and annealing the Ti substrate.

For convenience, the $TiO_2$ NTA obtained using the electrolyte containing n wt % ($1.5 \leq n \leq 2.5$) is referred to as Example n. In addition, the $TiO_2$ NTA obtained using the electrolyte containing m wt % (m<1.5 and m>2.5) is referred to as Comparative Example m. In addition, the $TiO_2$ NTA according to Example n with excellent orientation characteristics of the crystal grains is generally called p-NTA. In addition, the $TiO_2$ NTA according to Comparative Example m in which crystal grains are randomly oriented is generally called r-NTA.

Comparison Between Examples and Comparative Examples

Comparison of Structures

Figure 2:
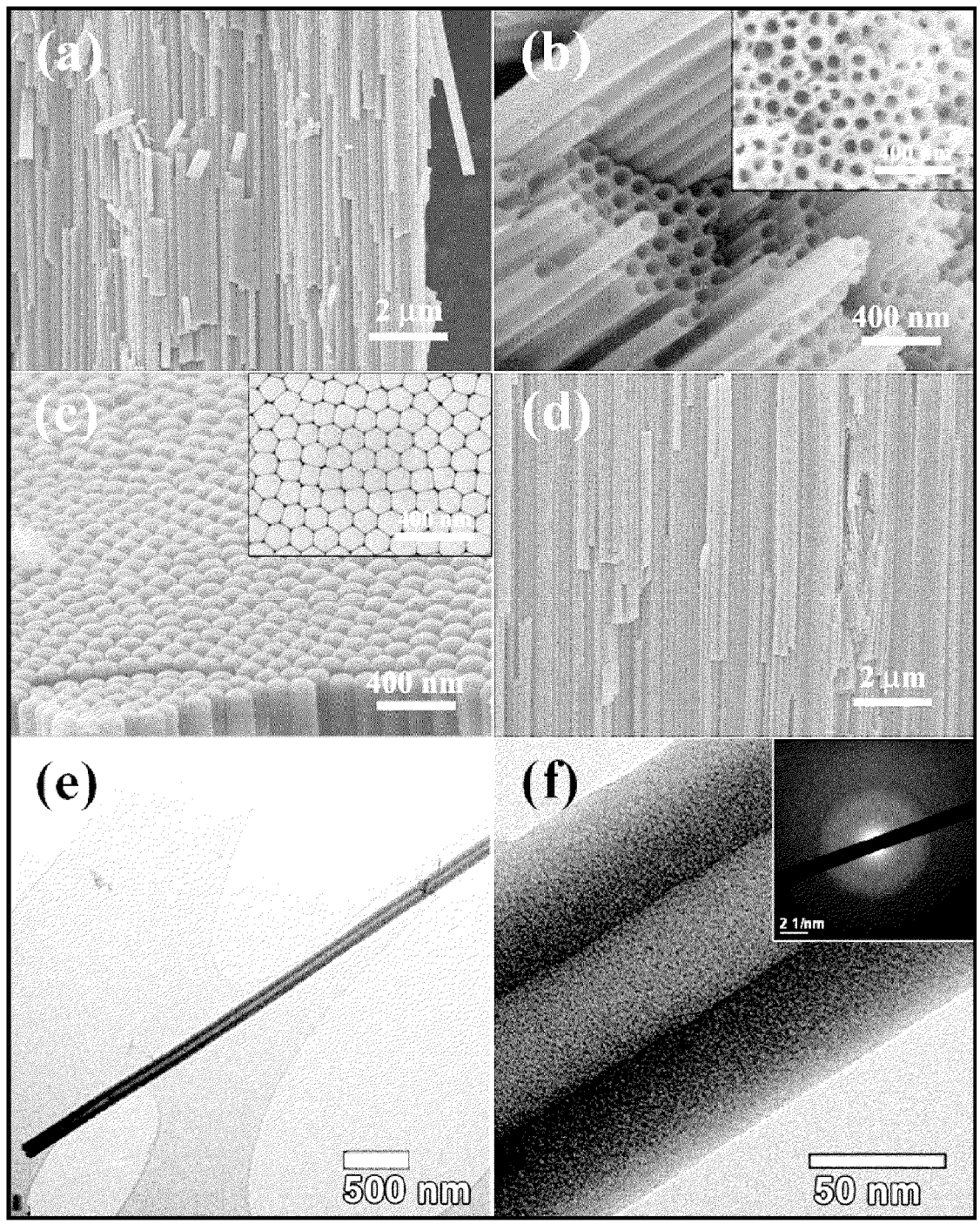
FIGS. 2a to 2c are FE-SEM (Field Emission Scanning Electron Microscope) images showing a cross section, an upper surface and a lower surface of NTA (Nano Tube Array) according to Example 2.0 just after anodizing. In addition.
FIG. 2d is an FE-SEM image showing a cross section of NTA according to Comparative Example 5.0 just after anodizing. In addition.
FIGS. 2e and 2f are TEM images showing a single nano tube of the NTA according to Example 2.0 just after anodizing.

FIGS. 2a to 2c are FE-SEM (Field Emission Scanning Electron Microscope) images showing a cross section, an upper surface and a lower surface of NTA according to Example 2.0 just after anodizing. In addition, FIG. 2d is an FE-SEM image showing a cross section of NTA according to Comparative Example 5.0 just after anodizing. In addition, FIGS. 2e and 2f are TEM images showing a single nano tube of the NTA according to Example 2.0 just after anodizing. A small picture in the FIG. 2f shows a SAD (Selected Area electron Diffraction) pattern of the nano tube. For reference, the FE-SEM images were obtained using JSM 6330F models, produced by JEOL, and the TEM images were obtained using JEM 3000F models, produced by JEOL.

Referring to FIGS. 2a to 2d, it could be understood that the NTAs according to Example 2.0 and Comparative Example 5.0 have regular nano tube alignments vertically grown on Ti substrates. Each nano tube has an average outer diameter of 150 nm. The NTA according to Example 2.0 has a length of 11.5 um. Referring to FIGS. 2e to 2f, the $TiO_2$ nano tube has a straight shape and its wall thickness is about 50 nm. The SAD pattern of FIG. 2f shows that the $TiO_2$ nano tube is amorphous.

Comparison of Orientation Characteristics of Crystal Grains

Figure 3:
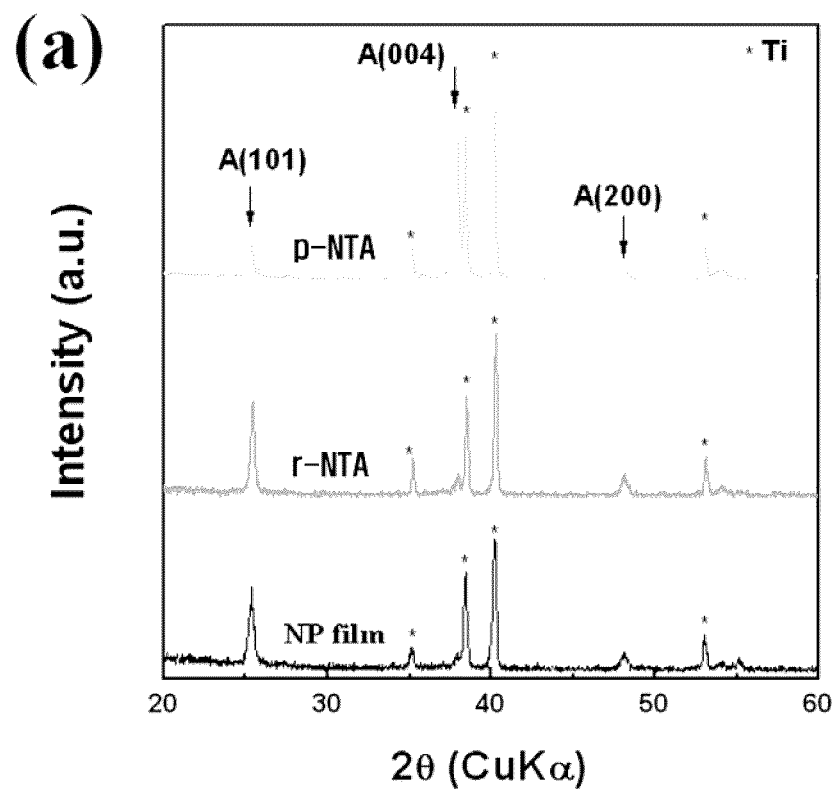
FIG. 3a shows an XRD pattern of NPF (Nano Particle Film), r-NTA and p-NTA after annealing at 450° C. for 1 hour.
FIG. 3b is a graph showing an intensity ratio $I_{(004)}/I_{(200)}$ of the intensity of the (004) plane peak with respect to the intensity of the (200) plane peak according to the moisture content in an electrolyte. A small picture included in FIG. 3b shows a unit lattice, a crystal surface and an axial direction of $TiO_2$ anatase crystals having a tetragonal crystal system.
Figure 3:
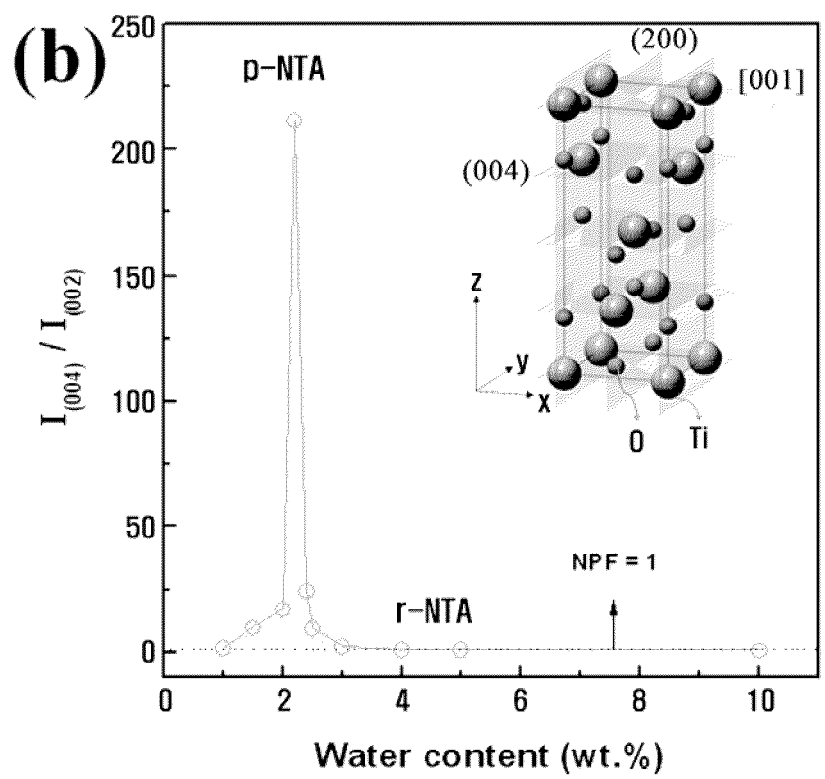

FIG. 3a shows an XRD pattern of NPF, r-NTA and p-NTA after annealing at 450° C. for 1 hour. FIG. 3b is a graph showing an intensity ratio $I_{(004)}/I_{(200)}$ of the intensity of the (004) plane peak with respect to the intensity of the (200) plane peak according to the moisture content in an electrolyte. A small picture included in FIG. 3b shows a unit lattice, a crystal surface and an axial direction of $TiO_2$ anatase crystals having a tetragonal crystal system. For reference, the XRD pattern was obtained using M18XHF-SRA models, produced by MAC Science.

Referring to FIG. 3a, it could be understood that, in the XRD graph for p-NTA, the peak intensity of (004) plane is much greater than the peak intensity of (200) plane. It means that crystal grains of a vertically grown nano tube are well oriented in the [001] direction perpendicular to the (004) plane. For reference, the as-anodized $TiO_2$ NTA is changed into anatase $TiO_2$ NTA during the annealing as crystal grains are grown. The anatase $TiO_2$ has a tetragonal crystal system as shown in the small picture inserted in FIG. 3b, and the [001] direction is identical to the C-axis direction of the tetragonal crystal system.

In addition, referring to FIG. 3b, it could be understood that the $I_{(004)}/I_{(200)}$ value of NTA varies depending on the moisture content of the electrolyte used in the anodizing. In particular, it could be found that the $I_{(004)}/I_{(200)}$ value of p-NTA is much greater than the $I_{(004)}/I_{(200)}$ value of r-NTA. A maximum value of the $I_{(004)}/I_{(200)}$ value is 211, which is the case of NTA according to Example 2.2. In addition, the r-NTA obtained using electrolyte whose moisture content is greater than 3 wt % or smaller than 1.5 wt % has a very low $I_{(004)}/I_{(200)}$ value close to about 1. The fact that the $I_{(004)}/I_{(200)}$ value is close to 1 means that crystal grains of NTA are randomly oriented. Therefore, it could be understood from FIGS. 3a and 3b that crystal grains of the r-NTA are randomly oriented, while crystal grains of the p-PTA are well oriented in [001] direction.

Table 1 below shows measured values of FWHM (Full Width at Half Maximum) of the rocking curve with respect to (004) plane peak, based on the XRD analysis data for the nano tube according to the moisture content in the electrolyte used for manufacturing p-NTA and r-NTA.

Here, the rocking curve is a curve representing the change of X-ray diffraction intensity with respect to the change of an incident angle when X-ray is incident on a test piece, and it may be evaluated by the rocking curve how much the diffraction surface to be measured (here, the (004) plane) according to the incident angle of X-ray is distributed in the test piece. In addition, FWHM represents an angle width at the point where the intensity becomes a half based on the maximum intensity of the rocking curve.

TABLE 1

| | H$_2$O (wt %) | | | | | | | | | |
|---|---|---|---|---|---|---|---|---|---|---|
| | 1.0 | 1.5 | 2.0 | 2.2 | 2.4 | 2.5 | 3.0 | 4.0 | 5.0 | 10.0 |
| FWHM (θ) | ∞ | 20.3 | 16.5 | 11.1 | 16.4 | 20.1 | ∞ | ∞ | ∞ | ∞ |

Referring to Table 1, in the p-NTA manufactured using the electrolyte with a moisture content of 1.5 wt % to 2.5 wt %, FWHM for the rocking curve of (004) plane peak was measured in the range from 11.1 degrees to 20.3 degrees. Meanwhile, in the r-NTA manufactured using the electrolyte with a moisture content smaller than 1.5 wt % or greater than 2.5 wt %, it could be found that FWHM for the rocking curve of (004) plane peak cannot be measured. Therefore, considering the analysis results of Table 1 and the distribution of $I_{(004)}/I_{(200)}$ values shown in FIG. 3b together, it could be understood that the crystal grains of the nano tube are oriented in the (004) plane or the [001] direction of a tetragonal crystal system when the FWHM for the rocking curve of (004) plane peak of the XRD data is preferably in the range from 11.1 degrees to 20.3 degrees, more preferably in the range from 11.1 degrees to 16.5 degrees.

Figure 4:
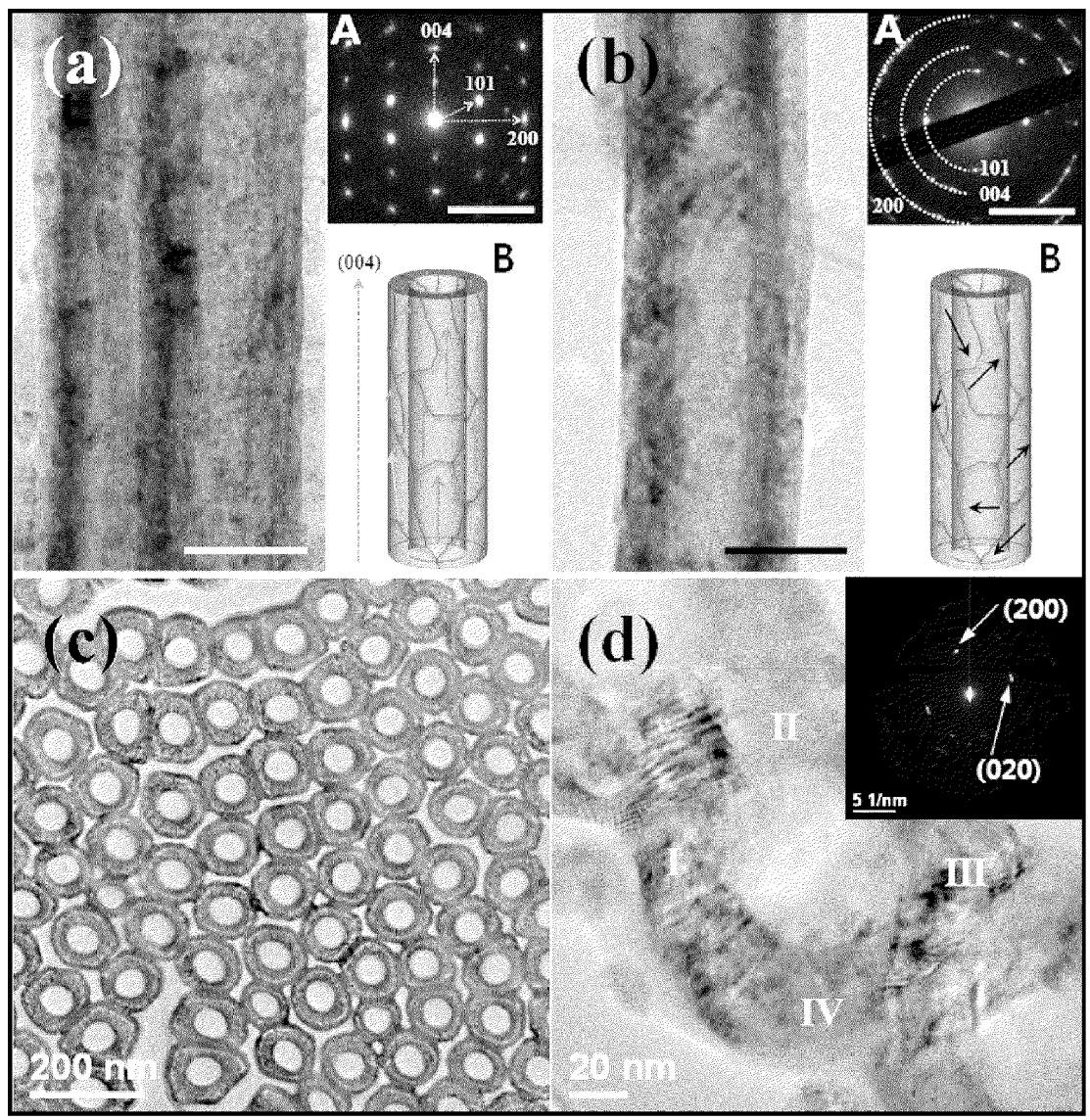
FIGS. 4a and 4b are TEM photographs respectively showing nano tubes of p-NTA [Example 2.0] and r-NTA [Comparative Example 5.0].
FIGS. 4c and 4d are TEM photographs showing a section of p-NTA [Example 2.0], taken by using a FIB (Focused Ion Beam) system.

FIGS. 4a and 4b are TEM photographs respectively showing nano tubes of p-NTA [Example 2.0] and r-NTA [Comparative Example 5.0], and the scale bar has a length of 100 nm. Small pictures A and B inserted into FIGS. 4a and 4b show SAD patterns (with a scale bar length of 5 nm) of the p-NTA and r-NTA nano tubes and schematic structures of the p-NTA and r-NTA nano tubes. Referring to FIGS. 4a and 4b, a relatively dark region corresponds to a wall of the nano tube, and a relatively light region corresponds to a cavity surrounded by the walls. The wall images are not clear but stained since the nano tube is composed of a plurality of crystal grains. The small picture inserted into FIG. 4a corresponding to the SAD pattern of the p-NTA nano tube is similar to the SAD pattern of a single crystal since the crystal grains of the NTA are well oriented in the (004) plane (or, the [001] direction) of a tetragonal crystal system. Such SAD pattern analysis results are identical to the XRD analysis results recognized through FIGS. 3a and 3b. For reference, the diffraction pattern for the (004) plane is parallel to the length direction of the nano tube and perpendicular to the diffraction pattern for the (200) plane. Meanwhile, the SAD pattern for the r-NTA nano tube has a ring pattern since the r-NTA nano tube includes randomly oriented crystal grains. The nano tube architectures of p-NTA and r-NTA based on the analysis results are generally similar to the small picture B inserted into FIGS. 4a and 4b.

Figure 5:
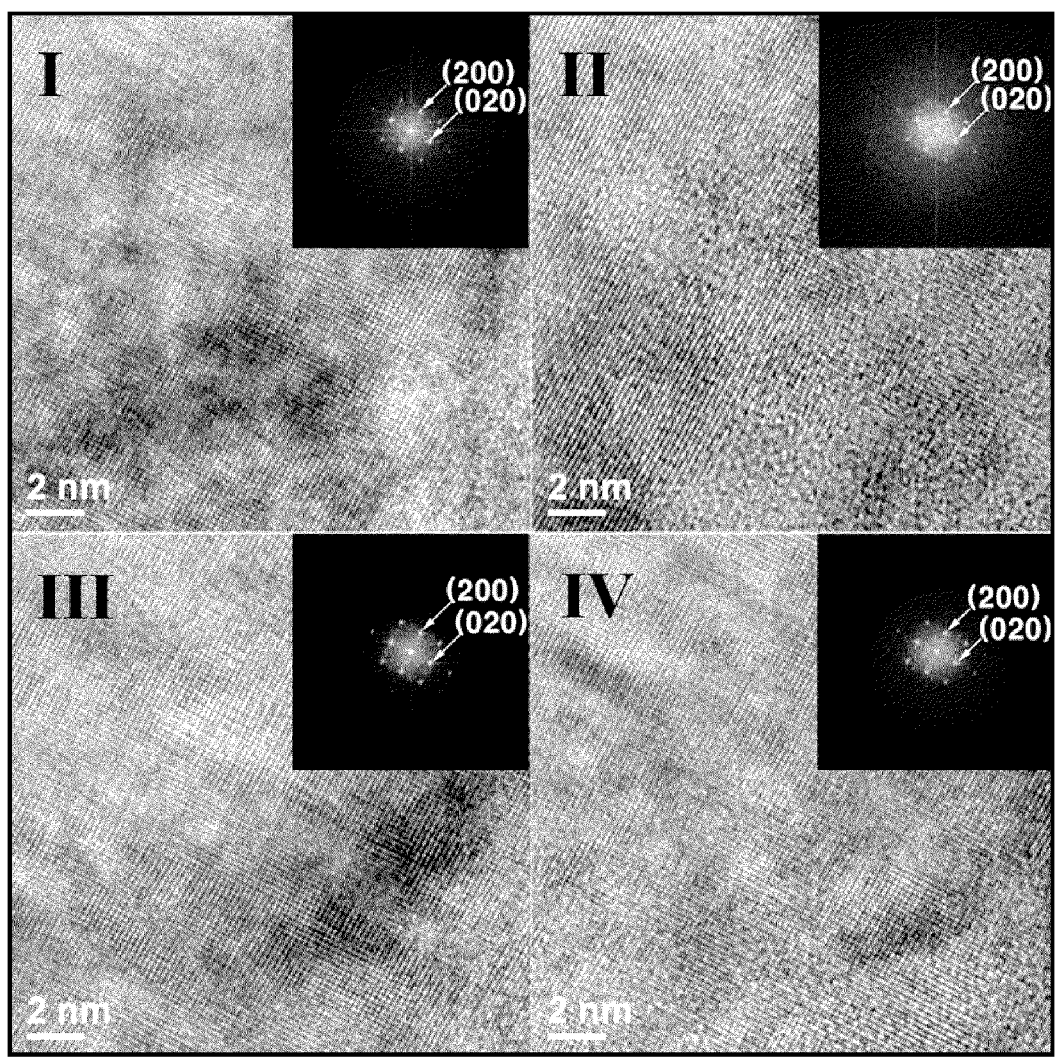
FIG. 5 are lattice images obtained by using HRTEM (High Resolution TEM) and FFT (Fast Fourier Transform) images (see inserted pictures) of the HRTEM images with respect to the regions I, II, III and IV of FIG. 4d.

FIGS. 4c and 4d are TEM photographs showing a section of p-NTA [Example 2.0], taken by using a FIB (Focused Ion Beam) system. The FIB system uses SMI3050SE models, produced by SII Nanotechnology. FIGS. 4c and 4d show that the nano tubes of p-NTA are well aligned in a vertical direction. The small picture inserted into FIG. 4d shows a SAD pattern obtained from a cross section of one nano tube of p-NTA, and in the SAD pattern, only the patterns of the (200) plane and the (020) plane perpendicular to (004) plane are observed with the pattern of the (004) plane as the center. These SAD patterns support the fact that the normal direction of the nano tube ring surface is the [001] direction. In addition, as shown in FIG. 5, the lattice images obtained using HRTEM (High Resolution TEM) for the regions I, II, III and IV shown in FIG. 4d and FFT (Fast Fourier Transform) images (see small pictures) of the HRTEM images also support the fact that a preferred orientation direction of the crystal grains of the p-NTA nano tube is the [001] direction.

Comparison of Concentration of Hydroxyl Groups of Nano Tube

Figure 6:
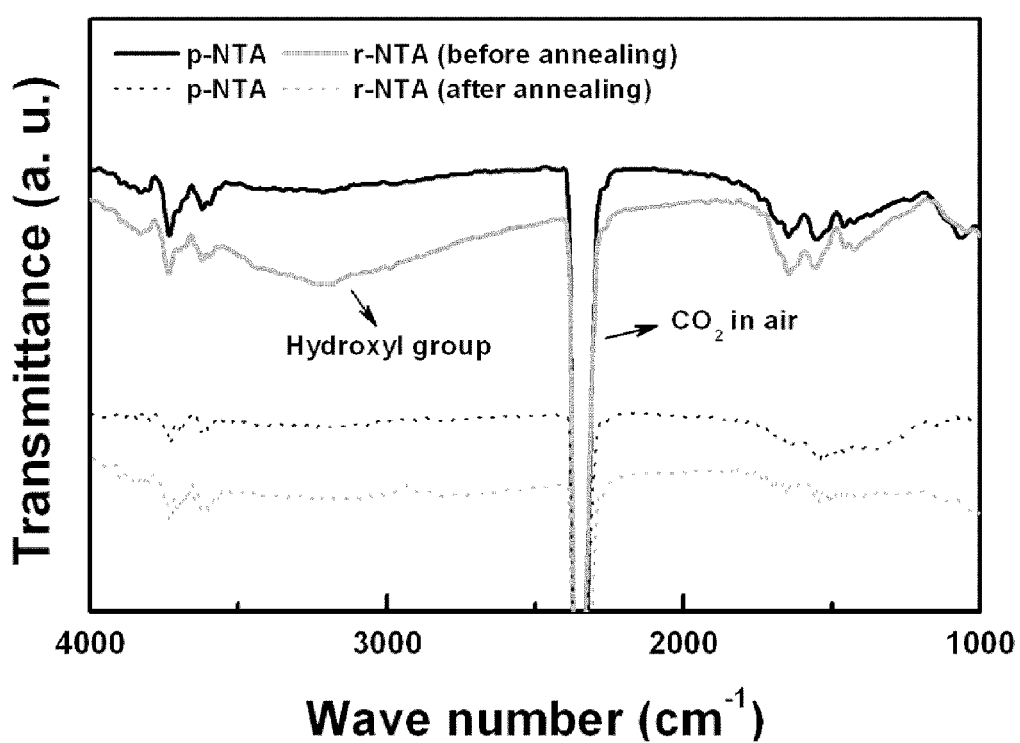
FIG. 6 shows measurement results of FTIR (Fourier Transform Infrared) spectrum with respect to p-NTA [Example 2.0] and r-NTA [Comparative Example 5.0] before and after annealing at 450° C.

FIG. 6 shows measurement results of FTIR (Fourier Transform Infrared) spectrum with respect to p-NTA [Example 2.0] and r-NTA [Comparative Example 5.0] before and after annealing at 450° C. The FTIR (Fourier Transform Infrared) spectrum was measured using Nicolet 6700 models, produced by Thermo scientific.

Referring to FIG. 6, it could be understood that the p-NTA contains relatively less hydroxyl groups than the r-NTA based on the state before the annealing, due to the following reasons. If a hydroxyl group is present in any material, absorption of infrared ray is observed in the wave number band of 3000 to 3600 cm$^{-1}$ of the FTIR spectrum. The wave number band of 3000 to 3600 cm$^{-1}$ is relevant to a shrinkage vibration mode of the hydroxyl group. Therefore, the presence and content of hydroxyl group in a material may be indirectly estimated according to the degree of infrared absorption observed in the wave number band. In other words, if the degree of infrared absorption is great in the wave number band, it could be recognized that hydroxyl groups are present as much.

Referring to FIG. 6, based on the state before the annealing is performed, p-NTA absorbs less infrared rays in the wave number band of 3000 to 3600 cm$^{-1}$ compared with r-NTA. It supports that the hydroxyl group content of p-NTA is smaller than the hydroxyl group content of r-NTA based on the state before the annealing is performed. The hydroxyl group originates from moisture contained in the electrolyte and functions as an oxidizer which helps oxidation of the nano tube. In addition, if NTA obtained by anodizing is annealed, NTA is crystallized as well as dehydrated, and at this time the hydroxyl group is estimated to destroy amorphous bulks into nano-sized anatase crystals. Therefore, if the hydroxyl group content in NTA is higher, it is more difficult to align the crystal grains of NTA to be oriented in a certain direction through the NTA crystallization process. Therefore, in order to align the crystal grains of NTA to be oriented in the [001] direction of a tetragonal crystal system, it is necessary to control the concentration of hydroxyl groups contained in NTA obtained by anodizing, into an optimized range. It is not easy to accurately investigate the correlation between the moisture content in the electrolyte used for the anodizing and the orientation of the annealed NTA. However, the present disclosure has great significance in revealing the facts that the moisture content in the electrolyte is one of the important factors in influencing the orientation characteristics of NTA and that the moisture content in the electrolyte should be controlled within the range from 1.5 wt % to 2.5 wt % to control the concentration of hydroxyl groups contained in NTA before the annealing to an optimal range in order to improve the orientation characteristics, when manufacturing anatase TiO$_2$ NTA.

Applications of the Material

The p-NTA according to the present disclosure may be used as photoelectrode materials of DSSC which is a dye-sensitized solar cell. Hereinafter, the performance of DSSC (Example) manufactured using the p-NTA will be compared with the performance of DSSC manufactured using n-NTA and NPF.

In order to manufacture the DSSC according to the Example, p-NTA according to Example 2.0 with a thickness of 1.5 um was used as the p-NTA. In other words, the p-NTA was grown on a Ti substrate, and a dye was absorbed to the p-NTA to make a photoelectrode. In addition, FTO (Fluorine-doped Tin Oxide) is coated with Pt to make an opponent electrode. The electrolyte and dye of the DSSC respectively used AN-50 iodine electrolyte and N719 dye, produced by Solaronix. The opponent electrode was prepared by spin-coating a FTO electrode with isopropanol to which a $H_2PtCl_6$ solution was added to a concentration of 5 mM, and then annealing the FTO electrode at 450° C. under an air circumstance. The DSSC according to the Comparative Example was manufactured using n-NTA [Comparative Example 5.0] and NPF as the photoelectrode material. When the DSSC according to the Comparative Example was manufactured, the specifications of the DSSC were substantially identically applied, except for the photoelectrode material. The photoelectric characteristics of the DSSCs according to the Example and the Comparative Example were measured using a potentiostat under the photo intensity of 100 mW/cm² provided by a solar simulator.

Figure 7:
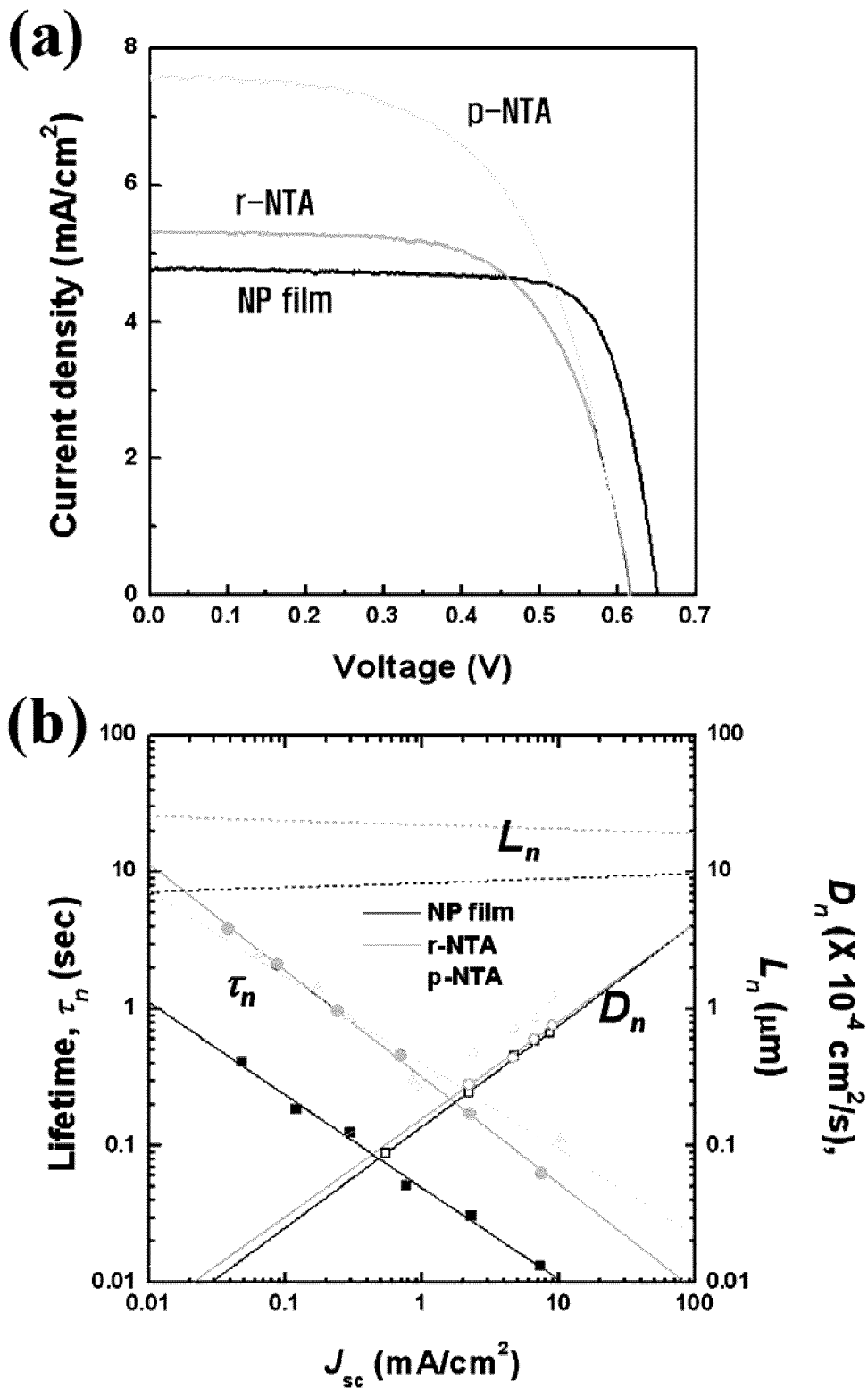
FIG. 7a shows J-V characteristics of DSSC according to examples and comparative examples.
FIG. 7b shows electron diffusion coefficient $D_n$, electron lifetimes $\tau_n$ and electron diffusion lengths ($L_n=(D_n\tau_n)^{1/2}$) of DSSC to which p-NTA, n-NTA and NPF are applied.

FIG. 7a shows J-V characteristics of DSSC according to examples and comparative examples. Referring to FIG. 7a, the DSSCs to which p-NTA, n-NTA and NPF are applied respectively have energy conversion efficiency of 2.7%, 2.1% and 2.4%. From this result, it could be understood that the DSSC to which p-NTA is applied has great energy conversion efficiency. In addition, the DSSCs to which p-NTA, n-NTA and NPF are applied respectively have photocurrent densities $J_{sc}$ of 7.63 mA/cm², 5.31 mA/cm² and 5.01 mA/cm². From this result, it could be understood that the DSSC to which p-NTA is applied has a very high photocurrent density. The photocurrent density $J_{sc}$ is determined by several factors including light-harvesting property, quantum yield for electron injection from dye molecules to $TiO_2$ conduction band, and electron collection property. Here, the light-harvesting property is directly related to the amount of dye loading. The amounts of dye loading of the DSSCs to which p-NTA, n-NTA and NPF are applied are respectively 1.49×10⁻⁷ mol/cm², 1.33×10⁷ mol/cm² and 1.65×10⁷ mol/cm². The DSSC to which NPF is applied has the greatest amount of dye loading. Therefore, the light-harvesting property does not easily explain the high photocurrent density of the DSSC to which p-NTA is applied. In addition, since the same dye is used for the DSSCs to which p-NTA, n-NTA and NPF are applied, the effect of the quantum yield for electron injection on the difference in photocurrent densities seems to be negligible. Therefore, it could be understood that the difference in photocurrent densities originates from the difference in electron collection property.

The p-NTA may be expected to exhibit excellent electron collection efficiency due to the highly ordered one-dimensional orientation geometry compared to NPT. The electron collection property may be evaluated by measuring electron diffusion coefficient $D_n$, lifetimes $\tau_n$ and electron diffusion lengths ($L_n=(D_n\tau_n)^{1/2}$). These data are collected by the measurements of SLIM-PV (Stepped Light Induced Transient PhotoVoltage) and SLIM-PC (Stepped Light Induced Transient PhotoCurrent) with a laser diode of 660 nm.

FIG. 7b shows electron diffusion coefficient $D_n$, electron lifetimes $\tau_n$ and electron diffusion lengths ($L_n=(D_n\tau_n)^{1/2}$) of DSSC to which p-NTA, n-NTA and NPF are applied. Referring to FIG. 7b, it could be understood that the DSSCs to which p-NTA and n-NTA are applied have a longer lifetime $\tau_n$ compared with the DSSC to which NFP is applied. In addition, it should also be noted that the DSSC to which p-NTA is applied has a very great electron diffusion coefficient $D_n$ compared with other DSSCs, and the DSSCs to which r-NTA and NPF are applied do not exhibit a great difference in electron diffusion coefficient $D_n$. This analysis results reveal that the electron transport property of $TiO_2$ NTA may be improved by enhancing the orientation characteristics of the crystal grains of NTA. The $TiO_2$ NTA with improved orientation characteristics of the crystal grains is in a state that defect regions such as a grain boundary with a great angle, which causes scattering and collection of charge carriers, are decreased. Such defect region decrease plays an important role in improving the transport property of the charge carriers. The $TiO_2$ NTA according to the present disclosure has not only fast electron transport property and slow recombination property but also longer diffusion lengths ($L_n=(D_n\tau_n)^{1/2}$) of charge carriers, compared with the DSSCs to which r-NTA and NPF are applied. If the diffusion length of the charge carriers is improved, the charge collection efficiency is greatly increased. Therefore, it could be considered that the great photocurrent density and high energy conversion efficiency of the DSSC to which p-NTA is applied mainly originate from high electron collection property of $TiO_2$ NTA. In addition, the fact that the DSSC to which p-NTA is applied has a long diffusion length $L_n$ means that the thickness of the $TiO_2$ layer may be further increased. If the thickness of the $TiO_2$ layer is increased, the light-harvesting efficiency may be further improved.

The $TiO_2$ NTA according to the present disclosure may be applied to various products other than DSSC. In other words, the $TiO_2$ NTA according to the present disclosure may be applied to photocatalyst devices such as a photocatalyst hydrogen generator, quantum dot-sensitized solar cells, organic thin film solar cells, and so on, as desired. Therefore, the scope of the present disclosure is not specially limited to the kind of products to which the $TiO_2$ NTA is applied, as apparent to those having ordinary skill in the art.

In addition, the method for manufacturing the $TiO_2$ NTA according to the present disclosure is not specially limited to the kind of the nano tube material. Therefore, $Al_2O_3$, $Ta_2O_5$, $Nb_2O_5$ or the like with a preferred crystalline orientation may be manufactured by using the present disclosure, as apparent to those having ordinary skill in the art.

The present disclosure has been described in detail. However, it should be understood that the detailed description and specific examples, while indicating preferred embodiments of the present disclosure, are given by way of illustration only, since various changes and modifications within the spirit and scope of the present disclosure will become apparent to those skilled in the art from this detailed description.

What is claimed is:

1. A titanium oxide nano tube material, characterized in that crystal grains of a nano tube has a crystal structure oriented with the [001] direction of a tetragonal crystal system, wherein FWHM (Full Width at Half Maximum) of a rocking curve with respect to the (004) plane peak is 11.1 degrees to 16.5 degrees.

2. The titanium oxide nano tube material according to claim 1, wherein a $I_{(004)}/I_{(200)}$ value of the titanium oxide nano tube material, which is a relative ratio of peak intensities of (004) plane and (200) plane of XRD (X-ray Diffraction) data, is 5 or above.

3. The titanium oxide nano tube material according to claim 1, wherein the titanium oxide nano tube material includes nano tube arrays of anatase titanium oxide vertically grown by anodizing on a titanium substrate.

4. The titanium oxide nano tube material according to claim 1, wherein an electron diffusion length of a charge carrier of the titanium oxide nano tube material is 20 μm to 50 μm.

5. A method for manufacturing a titanium oxide nano tube material, comprising:
(a) preparing an electrolyte with a moisture content of 2.0 to 2.4 wt %;
(b) growing a titanium oxide nano tube on a titanium substrate by anodizing in a state in which the titanium substrate is immersed in a container containing the electrolyte;
(c) cleaning and drying the titanium substrate on which the titanium oxide nano tube is grown; and
(d) annealing the dried titanium substrate to crystallize the grown titanium oxide nano tube such that crystal grains of the titanium oxide nano tube are oriented with the [001] direction of a tetragonal crystal system and FWHM (Full Width at Half Maximum) of a rocking curve with respect to the (004) plane peak is 11.1 degrees to 16.5 degrees.

6. The method for manufacturing a titanium oxide nano tube material according to claim 5, wherein said preparing the electrolyte includes:
removing residual moisture from the electrolyte; and
adding 2.0 to 2.4 wt % of moisture to the electrolyte free from the residual moisture.

7. The method for manufacturing a titanium oxide nano tube material according to claim 6, wherein the residual moisture in the electrolyte is removed by evaporation.

8. The method for manufacturing a titanium oxide nano tube material according to claim 5, wherein the titanium oxide nano tube is grown under an inert gas atmosphere.

9. The method for manufacturing a titanium oxide nano tube material according to claim 8, wherein the inert gas circumstance is a nitrogen gas atmosphere.

10. The method for manufacturing a titanium oxide nano tube material according to claim 5, wherein said annealing the titanium substrate is performed in a temperature range from 300° C. to 600° C. for 10 minutes or more.

11. A photoelectric conversion device comprising the titanium oxide nano tube material defined in claim 1 as an electrode material.

12. A product comprising the titanium oxide nano tube material defined in claim 1.

* * * * *